(12) United States Patent
Gillmor et al.

(10) Patent No.: US 9,337,738 B2
(45) Date of Patent: May 10, 2016

(54) TRANSFORMER-COUPLED GATE-DRIVE POWER REGULATOR SYSTEM

(71) Applicant: TEXAS INSTRUMENTS INCORPORATED, Dallas, TX (US)

(72) Inventors: Colin Gillmor, Limerick (IE); George Young, Dublin (IE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 204 days.

(21) Appl. No.: 13/948,525

(22) Filed: Jul. 23, 2013

(65) Prior Publication Data
US 2014/0029314 A1    Jan. 30, 2014

Related U.S. Application Data

(60) Provisional application No. 61/675,182, filed on Jul. 24, 2012.

(51) Int. Cl.
| | | |
|---|---|---|
| G05F 1/00 | (2006.01) | |
| H02M 3/335 | (2006.01) | |
| H03B 1/00 | (2006.01) | |
| H03K 3/00 | (2006.01) | |
| H02M 1/08 | (2006.01) | |
| H02M 3/158 | (2006.01) | |
| H03K 17/691 | (2006.01) | |
| H02M 1/00 | (2006.01) | |

(52) U.S. Cl.
CPC ............ H02M 3/33507 (2013.01); H02M 1/08 (2013.01); H02M 3/158 (2013.01); H03K 17/691 (2013.01); H02M 2001/0006 (2013.01)

(58) Field of Classification Search
CPC ............ H02M 3/335; H02M 3/33507; H02M 3/3353; H02M 3/33538; H02M 3/33546; H02M 3/33523; H02M 2001/0025; H02M 1/4233; H02M 1/4258; H02M 2001/0006; H02M 1/08; H03K 17/687; H03K 17/693; H03K 17/102; H03K 2217/0054; H03K 2217/0018; H03K 17/689; H03K 17/691
USPC ................ 323/222–226, 247, 249, 251, 252, 323/271–275, 282–287, 289, 351; 307/106–108, 125–131; 327/108–112, 327/365, 374–377, 423, 424, 432, 434, 327/564; 363/15–26, 40–42, 89, 90, 95–99, 363/123–127, 131–136
See application file for complete search history.

(56) References Cited

U.S. PATENT DOCUMENTS

| | | | | |
|---|---|---|---|---|
| 4,607,210 | A | * | 8/1986 | Ohms et al. .................... 323/290 |
| 5,550,497 | A | * | 8/1996 | Carobolante ................. 327/110 |
| 2009/0196072 | A1 | * | 8/2009 | Ye .................................... 363/17 |

*Primary Examiner* — Timothy J Dole
*Assistant Examiner* — Carlos Rivera-Perez
(74) *Attorney, Agent, or Firm* — William B. Kempler; Frank D. Cimino

(57) ABSTRACT

A transformer-coupled gate-drive power regulator system is provided that includes a feedback stage that generates a PWM signal having a duty-cycle that is based on a magnitude of an output voltage in an output stage. A switch driver stage configured to provide each of a first control signal and a second control signal based on the PWM signal. A switching stage comprising a first transformer input stage, a second transformer input stage, and a control switch. The first transformer input stage activates the control switch via the first control signal while the second transformer input stage is deactivated, and the second transformer input stage activates the control switch via the second control signal while the first transformer input stage is deactivated. The control switch can be configured to provide current through an output inductor in the output stage to generate the output voltage in response to being activated.

15 Claims, 3 Drawing Sheets

TRANSFORMER-COUPLED GATE-DRIVE POWER REGULATOR SYSTEM

CROSS-REFERENCE TO RELATED APPLICATION

This application claims the benefit of U.S. Provisional Patent Application 61/675,182 filed on 24 Jul. 2012, entitled "A GATE DRIVE TRANSFORMER WITH ARBITRARILY HIGH DUTY CYCLES", the entirety of which is incorporated by reference herein.

TECHNICAL FIELD

This disclosure relates generally to electronic circuit systems, and more specifically to a transformer-coupled gate-drive power regulator system.

BACKGROUND

Power regulator systems can be implemented in a variety of electronic devices for regulating an output voltage to provide power to one or more circuit components in the electronic device. One such type of power regulator system is a switching power regulator, such as a buck converter, in which high-side and low-side switches are alternately activated to generate a switching voltage that provides an output current through an output inductor to generate an output voltage. Some power regulator systems implement a transformer-coupled gate-drive in the input stage to provide substantially greater power efficiency, such as based on controlling a power switch based on a voltage generated at a secondary winding of the transformer in the input stage.

SUMMARY

A transformer-coupled gate-drive power regulator system is provided that includes a feedback stage that generates a PWM signal having a duty-cycle that is based on a magnitude of an output voltage in an output stage. A switch driver stage configured to provide each of a first control signal and a second control signal based on the PWM signal. A switching stage comprising a first transformer input stage, a second transformer input stage, and a control switch. The first transformer input stage activates the control switch via the first control signal while the second transformer input stage is deactivated, and the second transformer input stage activates the control switch via the second control signal while the first transformer input stage is deactivated. The control switch can be configured to provide current through an output inductor in the output stage to generate the output voltage in response to being activated.

Another embodiment includes a method for activating a control switch in a transformer-coupled gate-drive power regulator system. The method includes generating a PWM signal having a duty-cycle that is based on a magnitude of an output voltage in an output stage, the duty-cycle being defined by an on-time in a given period of the PWM signal. The method also includes providing a first control signal and a second control signal based on the on-time of the PWM signal. The method also includes activating a first transformer input stage in response to the first control signal to provide an activation voltage at a control node while a second transformer input stage is deactivated, and activating the second transformer input stage in response to the second control signal to provide the activation voltage at the control node while the first transformer input stage is deactivated. The method further includes activating the control switch in response to the activation voltage to provide current through an output inductor in the output stage.

Another embodiment includes a transformer-coupled gate-drive power regulator system. The system includes a feedback stage configured to generate a pulse-width modulation (PWM) signal having a duty-cycle that is based on a magnitude of an output voltage in an output stage, the duty-cycle being defined by an on-time in a given period of the PWM signal. The system also includes a switch driver stage comprising a duty-cycle comparator configured to compare the on-time with a duty-cycle threshold, the switch driver stage being configured to provide each of a first control signal and a second control signal based on the duration of the on-time relative to the duty-cycle threshold. The system further includes a switching stage comprising a first transformer input stage, a second transformer input stage, and a control switch, the first transformer input stage being configured to activate the control switch via the first control signal while the second transformer input stage is deactivated, and the second transformer input stage being configured to activate the control switch via the second control signal while the first transformer input stage is deactivated, the control switch being configured to provide current through an output inductor in the output stage to generate the output voltage in response to being activated.

DETAILED DESCRIPTION

Figure 1:
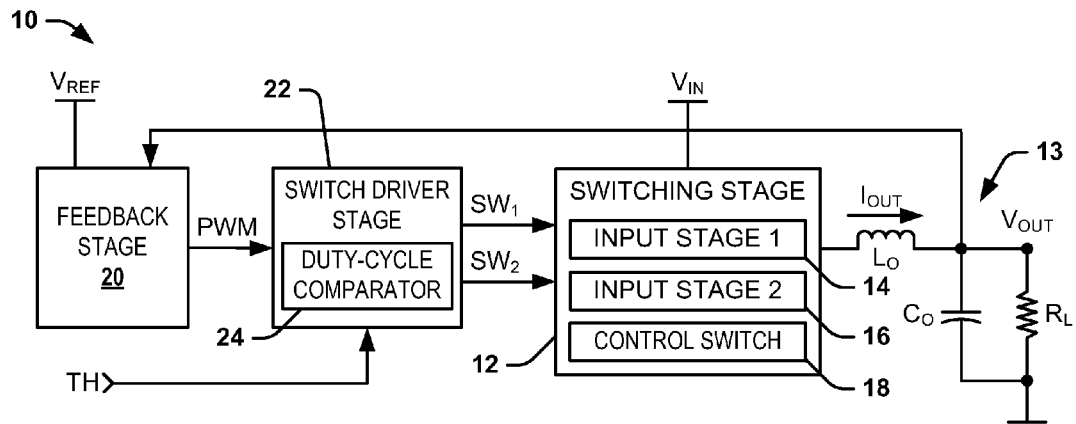
FIG. 1 illustrates an example of a transformer-coupled gate-drive power regulator system.

This disclosure relates generally to electronic circuit systems, and more specifically to a transformer-coupled gate-drive power regulator system. The transformer-coupled gate-drive power regulator system can include a feedback stage that is configured to generate a pulse-width modulation (PWM) signal based on a magnitude of an output voltage that is generated at an output stage. The PWM signal can have a duty-cycle that is defined by an on-time in a given period of the PWM signal based on the magnitude of the output voltage. The transformer-coupled gate-drive power regulator system also includes a switch driver stage that is configured to provide each of a first control signal and a second control signal based on the PWM signal. As an example, the first and second control signals can be provided based on a duration of the on-time, such as based on a comparison of the on-time with a predetermined on-time threshold. The transformer-coupled gate-drive power regulator system further includes a switching stage that includes a first transformer input stage, a second transformer input stage, and a control switch. The first transformer input stage can be configured to activate the control switch via the first control signal and the second transformer input stage can be configured to activate the control switch via the second control signal. The control switch can be configured to provide current through an output inductor in the output stage to generate the output voltage in response to being activated. As described herein, the term "provide" and all uses thereof with respect to the first and second control signals describes that the respective first and second control signals are set to a suitable magnitude that activates a switch in the respective first and second transformer input stage. In addition, as described herein, the terms "deactivated" and "deactivated state" with respect to the transformers describe that the primary winding of the respective transformers is disconnected from power (e.g., a power supply or from a low-voltage rail, such as ground), and thus has either a decreasing or approximately zero magnetic flux in the core thereof.

Based on the first and second control signals being provided based on the PWM signal, the first and second control signals can respectively deactivate the first and second transistor input stages in a manner to provide sufficient time to allow the magnetic flux in the transformer core to reset to approximately zero regardless of the duration of the on-time of the PWM signal. For example, the first and second control signals can be alternately provided to alternately activate the first and second transformer input stages at up to 100% duty-cycle of the PWM signal, such that the first transformer input stage allows the flux in the respective first transformer to reset to approximately zero while the second transformer input stage is activated, and the second transformer input stage allows the flux in the respective second transformer to reset to approximately zero while the first transformer input stage is activated. Accordingly, the transformer coupled gate-drive power regulator system can mitigate power consumption by implementing a transformer coupled gate-drive and achieve better power factor correction by operating at a higher duty-cycle than typical transformer-coupled gate-drive power regulator systems.

FIG. 1 illustrates an example of a transformer-coupled gate-drive power regulator system 10. The transformer-coupled gate-drive power regulator system 10 can be implemented in any of a variety of power regulation and/or conversion applications for providing an output voltage $V_{OUT}$ for a given load, demonstrated in the example of FIG. 1 as a resistor $R_L$. For example, the transformer-coupled gate-drive power regulator system 10 can be implemented as a buck DC/DC power regulator to provide DC power for the load $R_L$, such as in a portable computer or a wireless communication device. As another example, the transformer-coupled gate-drive power regulator system 10 can be implemented as an AC/DC power converter to convert an AC power to the DC output voltage $V_{OUT}$, such as for a power cable and/or a charging device. Because the transformer-coupled gate-drive power regulator system 10 implements transformers in the switching stage, as described herein, the transformer-coupled gate-drive power regulator system 10 can generate the output voltage $V_{OUT}$ in a much more power efficient manner than other types of switching regulators.

The transformer-coupled gate-drive power regulator system 10 includes a switching stage 12 that is configured to generate an output current $I_{OUT}$ through an output inductor $L_O$ in an output stage 13. The output current $I_{OUT}$ thus provides the output voltage $V_{OUT}$ across an output capacitor $C_O$ and across the load $R_L$. The switching stage 12 includes a first input stage 14, a second input stage 16, and a control switch 18. The first and second input stages 14 and 16 each include a switch and a transformer. The switch in the first input stage 14 is controlled by a first control signal $SW_1$ and the switch in the second input stage 16 is controlled by a second control signal $SW_2$. In response to activation of the respective switches, the transformer in each of the first and second input stages 14 and 16 conducts a current through a primary winding to generate a voltage on a secondary winding based on inductive coupling. The voltage is thus provided on a control node that activates the control switch 18 to conduct the output current $I_{OUT}$ from an input voltage $V_{IN}$.

The transformer-coupled gate-drive power regulator system 10 also includes a feedback stage 20 configured to generate a pulse-width modulation (PWM) signal, demonstrated as a signal PWM in the example of FIG. 1, based on the output voltage $V_{OUT}$. As an example, the feedback stage 20 can be configured to compare the output voltage $V_{OUT}$ with a reference voltage $V_{REF}$ to set a duty-cycle of the signal PWM based on the difference between the output voltage $V_{OUT}$ and the reference voltage $V_{REF}$. Therefore, the duty-cycle can be defined by an on-time having a duration that is based on the magnitude of the output voltage $V_{OUT}$. As described in greater detail herein, substantially any duty-cycle from approximately 0% to 100% can be set for operation of the transformer-coupled gate-drive power regulator system 10. The signal PWM is provided to a switch driver stage 22 that is configured to generate the first and second control signals $SW_1$ and $SW_2$ based on the signal PWM. In the example of FIG. 1, the switch driver stage 22 includes a duty-cycle comparator 24 that is configured to compare the on-time of the signal PWM with a predetermined threshold TH. As an example, the duty-cycle comparator 24 can include a set of logic elements that can determine the duration of the on-time of the signal PWM relative to the threshold TH, which can be programmable or static (e.g., 50% of the period).

In response to the on-time of the signal PWM being less than the on-time threshold TH, the switch driver stage 22 can provide (e.g., assert) the first switching signal $SW_1$ substantially concurrently with the on-time of the signal PWM and can de-assert the second switching signal $SW_2$ through the period of the signal PWM, such that the second switching signal $SW_2$ is not provided. However, in response to the on-time of the signal PWM being greater than the on-time threshold TH, the switch driver stage 22 can provide the first and second switching signals $SW_1$ and $SW_2$ in a manner to accommodate the high-duty cycle and to provide sufficient time for the magnetic flux in the respective transformer of each of the first and second input stages 14 and 16 to substantially reset.

As a first example, in response to the on-time of the signal PWM being greater than the on-time threshold TH, the switch driver stage 22 can provide the first switching signal $SW_1$ for a first portion of the on-time and can provide the second switching signal $SW_2$ for a second portion of the on-time. Thus, a sum of the first and second portions can be approximately equal to the on-time of the signal PWM. As another example, each of the first and second control signals $SW_1$ and $SW_2$ can be alternately provided in each period of the signal PWM in response to the on-time of the signal PWM being greater than the on-time threshold TH. Thus, the first control signal $SW_1$ is provided through the duration of the on-time in a given period of the signal PWM and the second control signal $SW_2$ is provided through the duration of the on-time in the next period of the signal PWM. As yet another example, each of the first and second control signals $SW_1$ and $SW_2$ can be alternately provided in each period of the signal PWM regardless of the duration of the on-time, such that the duty-cycle comparator 24 can be omitted from the switch driver stage 22.

Based on the control scheme of the transformer-coupled gate-drive power regulator system 10 in providing the first and second switching signals $SW_1$ and $SW_2$ based on the duration of the on-time of the signal PWM, the transformers in each of the first and second input stages 14 and 16 can have sufficient time to substantially completely reset the magnetic flux therein after deactivation of the respective switch in each of the first and second input stages 14 and 16. As a result, the transformer-coupled gate-drive power regulator system 10 can be operated at substantially any duty-cycle, from a very low duty-cycle to a very high duty-cycle manner (e.g., up to 100%), such as to achieve greater power factor correction. Accordingly, the transformer-coupled gate-drive power regulator system 10 can generate the output voltage $V_{OUT}$ in a manner that is more power efficient than other typical switching regulators, and with significant improvement in power factor correction relative to typical transformer-coupled gate-drive power regulators.

Figure 2:
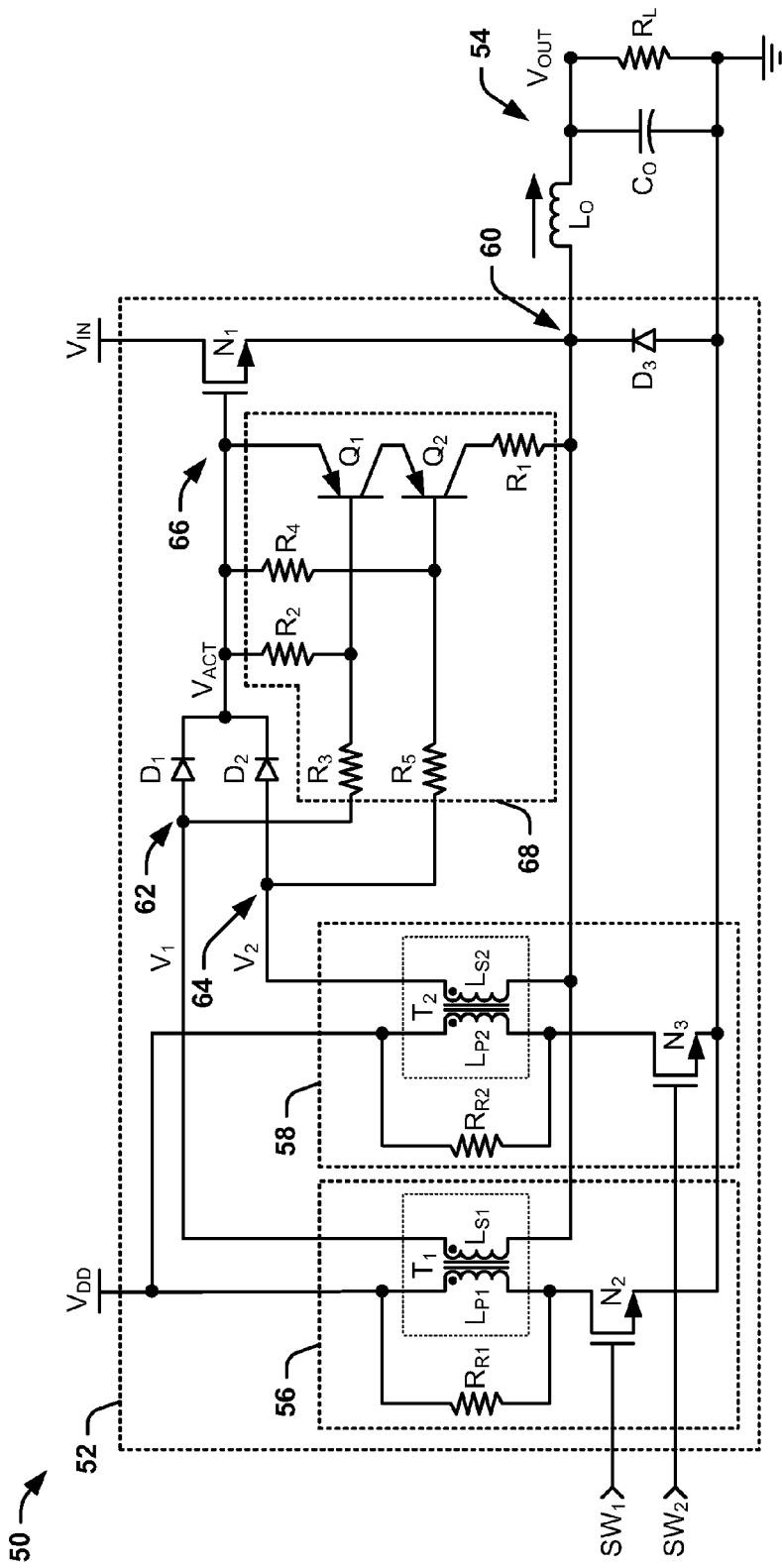
FIG. 2 illustrates an example of a transformer-coupled gate-drive power regulator circuit.

FIG. 2 illustrates an example of a transformer-coupled gate-drive power regulator circuit 50. The transformer-coupled gate-drive power regulator circuit 50 can be implemented in any of a variety of power regulation and/or conversion applications for providing an output voltage $V_{OUT}$ for a given load, demonstrated in the example of FIG. 2 as a resistor $R_L$. The transformer-coupled gate-drive power regulator circuit 50 includes a switching stage 52 that is configured to generate an output current $I_{OUT}$ through an output inductor $L_O$ in an output stage 54. The output current $I_{OUT}$ thus provides the output voltage $V_{OUT}$ across an output capacitor $C_O$ and across the load $R_L$. The switching stage 52 and the output stage 54 can correspond to the switching stage 12 and the output stage 13 in the example of FIG. 1. Therefore, reference is to be made to the example of FIG. 1 in the following description of the example of FIG. 2.

The switching stage 52 includes a first input stage 56, a second input stage 58, and a control switch $N_1$. The first input stage 56 includes a switch $N_2$ and a transformer $T_1$, and the second input stage 58 includes a switch $N_3$ and a transformer $T_2$. In the example of FIG. 2, the control switch $N_1$ and the switches $N_2$ and $N_3$ are each demonstrated as N-channel metal-oxide semiconductor field-effect transistor (MOSFET) switches, but could be implemented as a variety of other types of switches instead. The switch $N_2$ in the first input stage 56 is controlled by the first control signal $SW_1$ and the switch $N_3$ in the second input stage 58 is controlled by a second control signal $SW_2$. The control signals $SW_1$ and $SW_2$ can be generated by a switch driver stage, such as the switch driver stage 22 in the example of FIG. 1.

The transformer $T_1$ has a primary winding $L_{P1}$ that interconnects a drain of the switch $N_2$ and a DC power voltage $V_{DD}$ and a secondary winding $L_{S1}$ that interconnects a switching node 60 and a first node 62. Similarly, the transformer $T_2$ has a primary winding $L_{P2}$ that interconnects a drain of the switch $N_3$ and the voltage $V_{DD}$ and a secondary winding $L_{S2}$ that interconnects a switching node 60 and a second node 64. In addition, the first input stage 56 includes a reset resistor $R_{R1}$ in parallel with the primary winding $L_{P1}$, and the second input stage 58 includes a reset resistor $R_{R2}$ in parallel with the primary winding $L_{P2}$. In response to activation of the switch $N_2$, the primary winding $L_{P1}$ conducts a current from the voltage $V_{DD}$ to a low-voltage rail (demonstrated in the example of FIG. 2 as ground), which generates a voltage $V_1$ across the secondary winding $L_{S1}$, and thus on the first node 62, based on inductive coupling of the transformer $T_1$. Similarly, in response to activation of the switch $N_3$, the primary winding $L_{P2}$ conducts a current from the voltage $V_{DD}$ to ground, which generates a voltage $V_2$ across the secondary winding $L_{S2}$, and thus on the second node 64, based on inductive coupling of the transformer $T_2$. In response to deactivation of the switch $N_2$, the current through the primary winding $L_{P1}$ is discharged via the reset resistor $R_{R1}$ to decrease the voltage $V_1$. Similarly, in response to deactivation of the switch $N_3$, the current through the primary winding $L_{P2}$ is discharged via the reset resistor $R_{R2}$ to decrease the voltage $V_2$.

The switching stage 52 also includes a first diode $D_1$ interconnecting the first node 62 and a control node 66 and a second diode $D_2$ interconnecting the second node 64 and the control node 66. The control node 66 is coupled to a gate of the control switch $N_1$, and has an activation voltage $V_{ACT}$ that is based on the magnitude of either the voltage $V_1$ or the voltage $V_2$. Therefore, in response to a sufficient magnitude of the voltages $V_1$ or $V_2$ on either of the first or second nodes 62 or 64, the activation voltage $V_{ACT}$ can have sufficient magnitude to activate the control switch $N_1$ to conduct the output current $I_{OUT}$ from an input voltage $V_{IN}$ to the switching node 60 and through the output inductor $L_O$. The input voltage $V_{IN}$ can, for example, be the same as the voltage $V_{DD}$, or can be provided from a separate voltage source (e.g., an AC voltage rectifier).

The switching stage 52 further includes a deactivation circuit 68 that includes a first deactivation switch $Q_1$, a second deactivation switch $Q_2$, and a resistor $R_1$ arranged in series between the control node 66 and the switching node 60. In the example of FIG. 2, the deactivation switches $Q_1$ and $Q_2$ are demonstrated as PNP transistors, but could be implemented as a variety of different type of switches. A resistor $R_2$ interconnects the control node 66 and a base of the deactivation switch $Q_1$ and a resistor $R_3$ interconnects the first node 62 and the base of the deactivation switch $Q_1$. A resistor $R_4$ interconnects the control node 66 and a base of the deactivation switch $Q_2$ and a resistor $R_5$ interconnects the second node 64 and the base of the deactivation switch $Q_2$. When the voltage $V_1$ or the voltage $V_2$ has a sufficient magnitude to activate the control switch $N_1$, the deactivation switch $Q_1$ or the deactivation switch $Q_2$, respectively, is deactivated. However, upon a decrease of both of the voltages $V_1$ and $V_2$ to a sufficiently low magnitude, such as in response to deactivation of both of the switches $N_2$ and $N_3$, the deactivation switches $Q_1$ and $Q_2$ both activate to couple the control node 66 to the switching node 60 via the resistor $R_1$, thus deactivating the control switch $N_1$. Upon deactivation of the control switch $N_1$, the output inductor $L_O$ conducts the output current $I_{OUT}$ from ground through a diode $D_3$.

Similar to as described previously regarding the example of FIG. 1, the control signals $SW_1$ and $SW_2$ can be provided based on the signal PWM, such as based on an on-time of the signal PWM relative to an on-time threshold. For example, the duty-cycle comparator 24 can compare the on-time of the signal PWM with a predetermined threshold TH to provide the control signals $SW_1$ and $SW_2$. Therefore, upon deactivation of the respective switches $N_2$ and $N_3$, the respective currents through the primary windings $L_{P1}$ and $L_{P2}$ can be substantially completely discharged via the respective reset resistors $R_{R1}$ and $R_{R2}$ before the switches $N_2$ and $N_3$ are activated again. Accordingly, the magnitudes of the voltage $V_1$ and $V_2$ can be properly controlled in a given period of the signal PWM based on a lack of residual voltage across the respective secondary windings $L_{S1}$ and $L_{S2}$ upon reactivation of the respective switches $N_2$ and $N_3$.

Figure 3:
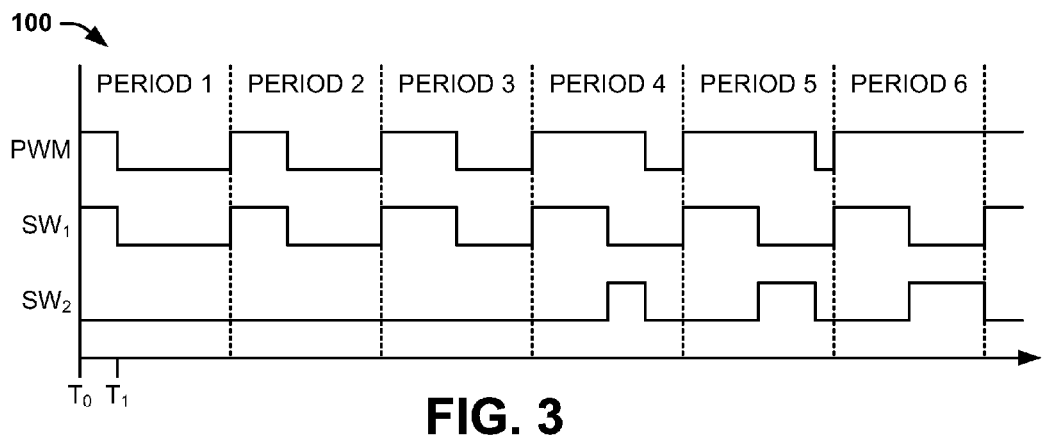
FIG. 3 illustrates an example of a timing diagram.

FIG. 3 illustrates an example of a timing diagram 100. The timing diagram 100 can describe one example of a manner in which the switch driver stage 22 provides the control signals $SW_1$ and $SW_2$. In the example of FIG. 3, the duty-cycle comparator 24 compares the duration of the on-time of the signal PWM with an on-time threshold, which is provided by example as 50% of the period of the signal PWM. The timing diagram 100 demonstrates the signal PWM, the control signal $SW_1$, and the control signal $SW_2$ as a function of time in each of six periods of the signal PWM, demonstrated in the example of FIG. 3 as PERIOD 1 through PERIOD 6.

In each of the first three periods of the signal PWM, the on-time of the signal PWM (i.e., between a time $T_0$ and a time $T_1$ in the first period) is less than or equal to the on-time threshold (e.g., 50%). Therefore, the switch driver stage 22 provides (i.e., asserts in the example of FIG. 3) the first control signal $SW_1$ as having a duration that is approximately concurrent with the on-time of the signal PWM. The switch driver stage 22 does not provide the second control signal $SW_2$ during the first three periods of the signal PWM, and thus the second control signal $SW_2$ is demonstrated as de-asserted in the first three periods of the signal PWM. Therefore, the switch $N_3$ is not activated during the first three periods of the signal PWM, such that the input stage 58 is in a deactivated state and the associated transformer $T_2$ is idle. The switch $N_2$ is activated during the assertion of the first control signal $SW_1$ to activate the control switch $N_1$, and is deactivated in response to de-assertion of the first control signal $SW_1$ to deactivate the input stage 56, during which time the magnetic flux of the transformer $T_1$ resets based on the current through the primary winding $L_{S1}$ being dissipated through the reset resistor $R_{R1}$.

In the fourth period of the signal PWM, the on-time of the signal PWM increases to greater than the on-time threshold (e.g., 50%), up to 100% in the sixth period of the signal PWM. Therefore, the switch driver stage 22 provides the first control signal $SW_1$ as having a duration that is approximately equal to the on-time threshold (e.g., 50%), at which time the switch driver stage 22 switches between providing the first control signal $SW_1$ and providing the second control signal $SW_2$ for the remainder of the duration of the on-time of the signal PWM. After the end of the on-time of the signal PWM in the fourth period, the switch driver stage 22 de-asserts both of the first and second control signals $SW_1$ and $SW_2$, during which time the respective magnetic fluxes of both of the transformers $T_1$ and $T_2$ are reset. At the beginning of the fifth period (e.g., the rising-edge of the signal PWM), the switch driver stage 22 again provides the first control signal $SW_1$ for a duration that is approximately equal to the on-time threshold, after which time the first control signal $SW_1$ is de-asserted and the second control signal $SW_2$ is asserted for the remainder of the on-time. In the sixth period of the signal PWM, the duty-cycle of the signal PWM is 100%, and thus the first control signal $SW_1$ is asserted for the first half of the period of the signal PWM and the second control signal $SW_2$ is asserted for the second half of the period of the signal PWM.

In this manner, neither of the first and second control signals $SW_1$ and $SW_2$ is provided by the switch driver stage 22 for more than half of the period of the signal PWM. As a result, in each period of the signal PWM, the transformers $T_1$ and $T_2$ each have at least half a period to reset magnetic flux via the respective reset resistors $R_{R1}$ and $R_{R2}$ before the respective switches $N_2$ and $N_3$ are reactivated. Accordingly, the transformer-coupled gate-drive power regulator circuit 50 can be operated up to 100% duty-cycle to achieve substantially improved power factor correction over typical transformer-coupled gate-drive power regulator systems.

Figure 4:
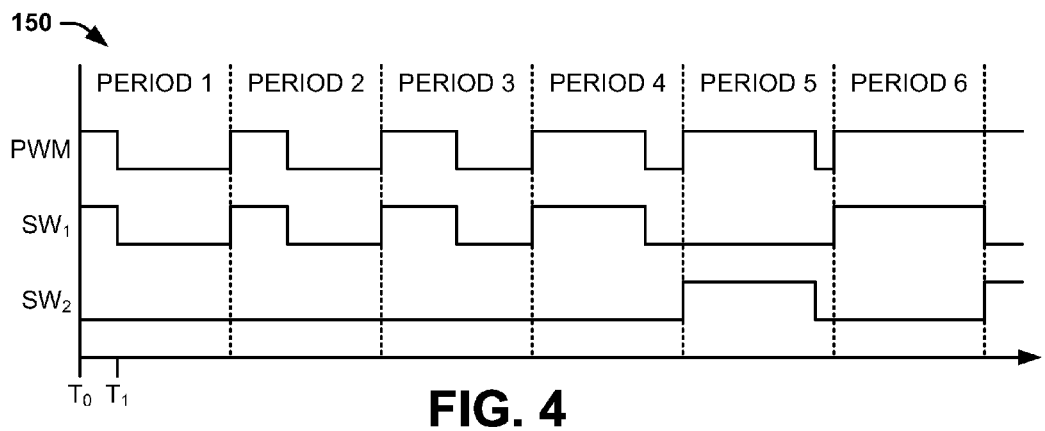
FIG. 4 illustrates another example of a timing diagram.

FIG. 4 illustrates another example of a timing diagram 150. The timing diagram 150 can describe another example of a manner in which the switch driver stage 22 provides the control signals $SW_1$ and $SW_2$. In the example of FIG. 4, the duty-cycle comparator 24 compares the duration of the on-time of the signal PWM with an on-time threshold, which is provided by example as 50% of the period of the signal PWM. The timing diagram 150 demonstrates the signal PWM, the control signal $SW_1$, and the control signal $SW_2$ as a function of time in each of six periods of the signal PWM, demonstrated in the example of FIG. 4 as PERIOD 1 through PERIOD 6.

In each of the first three periods of the signal PWM, the on-time of the signal PWM (i.e., between a time $T_0$ and a time $T_1$ in the first period) is less than or equal to the on-time threshold (e.g., 50%). Therefore, the switch driver stage 22 provides (i.e., asserts in the example of FIG. 4) the first control signal $SW_1$ as having a duration that is approximately concurrent with the on-time of the signal PWM. The switch driver stage 22 does not provide the second control signal $SW_2$ during the first three periods of the signal PWM, and thus the second control signal $SW_2$ is demonstrated as de-asserted in the first three periods of the signal PWM. Therefore, the switch $N_3$ is not activated during the first three periods of the signal PWM, such that the input stage 58 is in a deactivated state and the associated transformer $T_2$ is idle. The switch $N_2$ is activated during the assertion of the first control signal $SW_1$ to activate the control switch $N_1$, and is deactivated in response to de-assertion of the first control signal $SW_1$ to deactivate the input stage 56, during which time the magnetic flux of the transformer $T_1$ resets based on the current through the primary winding $L_{S1}$ being dissipated through the reset resistor $R_{R1}$.

In the fourth period of the signal PWM, the on-time of the signal PWM increases to greater than the on-time threshold (e.g., 50%), up to 100% in the sixth period of the signal PWM. Therefore, the switch driver stage 22 provides the first control signal $SW_1$ as having a duration that is approximately concurrent with the on-time of the signal PWM, and the second control switch $SW_2$ is not provided during the fourth period of the signal PWM. After the end of the on-time of the signal PWM in the fourth period, the switch driver stage 22 de-asserts the first control signal $SW_1$ for the remainder of the period of the signal PWM, during which time the magnetic flux of the transformer $T_1$ resets. At the beginning of the fifth period (e.g., the rising-edge of the signal PWM), the switch driver stage 22 provides the second control signal $SW_2$ for a duration that is approximately concurrent with the on-time of the signal PWM, and the first control switch $SW_1$ is not provided during the fifth period of the signal PWM. In the sixth period of the signal PWM, the duty-cycle of the signal PWM is 100%, and thus the first control signal $SW_1$ is asserted for the entirety of the sixth period while the second control signal $SW_2$ is de-asserted for the entirety of the sixth period of the signal PWM. Therefore, the first and second control signals $SW_1$ and $SW_2$ can be alternately and individually provided by the switch driver stage 22 with respect to each respective period of the PWM signal.

In this manner, the first and second control signals $SW_1$ and $SW_2$ are not both provided in the same period, and are each not provided in consecutive periods of the signal PWM. As a result, in each period of the signal PWM, one of the transformers $T_1$ and $T_2$ has the entire period to reset magnetic flux via a respective reset resistor $R_{R1}$ or $R_{R2}$ before the respective switch $N_2$ or $N_3$ is reactivated. Accordingly, the transformer-coupled gate-drive power regulator circuit 50 can be operated up to 100% duty-cycle to achieve substantially improved power factor correction over typical transformer-coupled gate-drive power regulator systems.

It is to be understood that the transformer-coupled gate-drive power regulator circuit 50 and the manner in which the control signals $SW_1$ and $SW_2$ are provided are not limited to the examples of FIGS. 2-4. For example, the on-time threshold is not limited to 50%, and can be set to a lesser on-time duration, such as based on the switching stage 52 including more than two input stages 56 and 58. As another example, the timing diagram 100 in the example of FIG. 3 is not limited to the first control switch $SW_1$ being provided up to the on-time threshold with the second control switch $SW_2$ being provided for the remainder of the on-time of the signal PWM. Instead, for example, the switch driver stage 22 can provide each of the first and second control signals $SW_1$ and $SW_2$ consecutively with respect to each other for half of the on-time of the signal PWM. Additionally, the timing diagram 150 in the example of FIG. 4 is not limited to the second control switch $SW_2$ not being provided during the first three periods, but the first and second control signals $SW_1$ and $SW_2$ could instead be alternately and individually provided with respect to every period of the signal PWM. In these examples, the duty-cycle comparator 24 could be omitted from the switch driver stage 22, such that these respective examples of the manner in which the first and second control signals $SW_1$ and $SW_2$ are provided are regardless of the duration of the on-time of the signal PWM.

Figure 5:
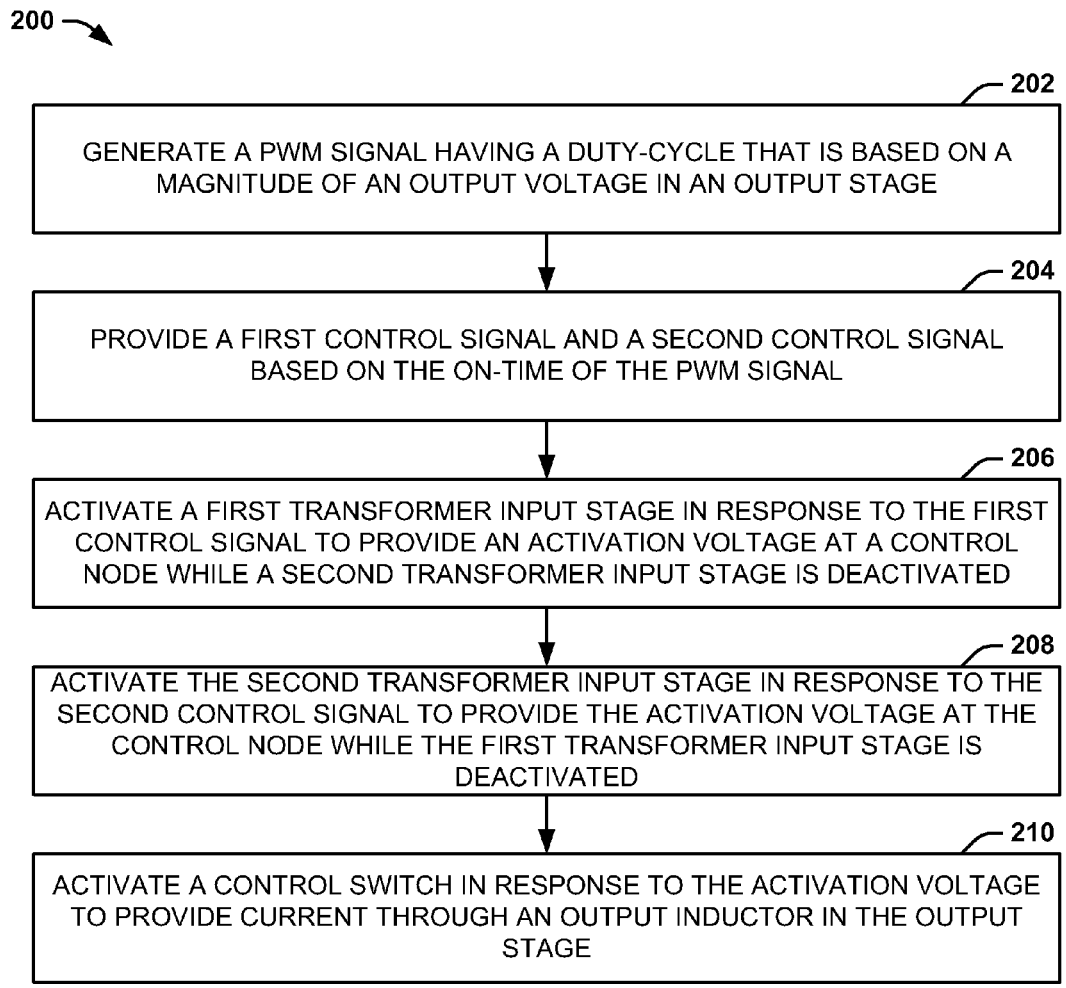
FIG. 5 illustrates an example of a method for assembling a switching power regulator system.

In view of the foregoing structural and functional features described above, certain methods will be better appreciated with reference to FIG. 5. It is to be understood and appreciated that the illustrated actions, in other embodiments, may occur in different orders and/or concurrently with other actions. Moreover, not all illustrated features may be required to implement a method.

FIG. 5 illustrates an example of a method 200 for activating a control switch (e.g., the control switch $N_1$) in a transformer-coupled gate-drive power regulator system (e.g., the transformer-coupled gate-drive power regulator system 10). At 202, a PWM signal (e.g., the signal PWM) is generated having a duty-cycle that is based on a magnitude of an output voltage (e.g., the output voltage $V_{OUT}$) in an output stage (e.g., the output stage 13). At 204, a first control signal (e.g., the first control signal $SW_1$) and a second control signal (e.g., the second control signal $SW_2$) are provided based on the on-time of the PWM signal. At 206, a first transformer input stage (e.g., the first input stage 14) is activated in response to the first control signal to provide an activation voltage (e.g., the activation voltage $V_{ACT}$) at a control node (e.g., the control node 66) while a second transformer input stage (e.g., the second input stage 16) is deactivated. At 208, the second transformer stage is activated in response to the second control signal to provide the activation voltage at the control node while the first transformer input stage is deactivated. At 210, the control switch is activated in response to the activation voltage to provide current (e.g., the output current $I_{OUT}$) through an output inductor (e.g., the output inductor $L_O$) in the output stage.

What have been described above are examples of the invention. It is, of course, not possible to describe every conceivable combination of components or method for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A signal transformer-coupled gate-drive power regulator system comprising: a feedback stage configured to generate a pulse-width modulation (PWM) signal having a duty-cycle that is based on a magnitude of an output voltage in an output stage, the duty-cycle being defined by an on-time in a given period of the PWM signal; a switch driver stage configured to provide each of a first control signal and a second control signal based on the PWM signal; and a switching stage comprising a first signal transformer input stage, a second signal transformer input stage, and a control switch, the first signal transformer input stage being configured to activate the control switch via the first control signal while the second signal transformer input stage is deactivated, the second signal transformer input stage being configured to activate the control switch via the second control signal while the first signal transformer input stage is deactivated, and the control switch being configured to provide current through an output inductor in the output stage to generate the output voltage in response to being activated, wherein the switch driver stage is configured to provide the first control signal substantially concurrently with the on-time and to not provide the second control signal during a period of the PWM signal in response to the on-time being less than a duty-cycle threshold associated with the period of the PWM signal, and wherein the switch driver stage is configured to provide the first control signal during a first portion of the duration of the on-time and to provide the second control signal during a second portion of the duration of the on-time in response to the on-time being greater than the duty-cycle threshold.

2. The system of claim 1, wherein the switch driver stage is configured to provide the first control signal during a first portion of the duration of the on-time and to provide the second control signal during a second portion of the duration of the on-time.

3. The system of claim 1, wherein the first and second control signals are alternately and individually provided by the switch driver stage with respect to each respective period of the PWM signal.

4. The system of claim 1, wherein the first signal transformer input stage comprises a first switch and a first transformer and the second signal transformer input stage comprises a second switch and a second transformer, the first switch being activated by the first control signal to provide a first current through a primary of the first transformer to activate the control switch based on a first voltage across a secondary of the first transformer, the second switch being activated by the second control signal to provide a second current through a primary of the second transformer to activate the control switch based on a second voltage across a secondary of the second transformer.

5. The system of claim 4, wherein the control switch is coupled to the respective secondary each of the first transformer and the second transformer via a respective first diode and a second diode.

6. The system of claim 4, wherein the switching stage further comprises a first deactivation switch and a second deactivation switch arranged in series between a control terminal of the control switch and a switching node to which the output inductor is coupled, the first and second deactivation switches being controlled via the secondary of each of the first and second transformers to deactivate the control switch during a complementary off-time of the PWM signal.

7. The system of claim 1, wherein the switch driver stage comprises a duty-cycle comparator configured to compare the on-time with the duty-cycle threshold, the first and second control signals being provided based on the duration of the on-time relative to the duty-cycle threshold.

8. The system of claim 7, wherein the second control signal is not provided in a given period of the PWM signal in response to the on-time being less than the duty-cycle threshold.

9. The system of claim 7, wherein the duty-cycle threshold is approximately 50% of the period of the PWM signal.

10. An integrated circuit (IC) comprising at least a portion of the power regulator system of claim 1.

11. A method for activating a control switch in a transformer-coupled gate-drive power regulator system, the method comprising: generating a pulse-width modulation (PWM) signal having a duty-cycle that is based on a magnitude of an output voltage in an output stage, the duty-cycle being defined by an on-time in a given period of the PWM signal; providing a first control signal and a second control signal based on the on-time of the PWM signal; activating a first signal transformer input stage in response to the first control signal to provide an activation voltage at a control node while a second signal transformer input stage is deactivated; activating the second signal transformer input stage in response to the second control signal to provide the activation voltage at the control node while the first signal transformer input stage is deactivated; and activating the control switch in response to the activation voltage to provide current through an output inductor in the output stage, wherein providing the first control signal and the second control signal comprises: providing the first control signal substantially concurrently with the on-time and not providing the second control signal during a period of the PWM signal in response to the on-time being less than a duty-cycle threshold associated with the period of the PWM signal; and providing the first control signal during a first portion of the duration of the on-time and providing the second control signal during a second portion of the duration of the on-time in response to the on-time being greater than the duty-cycle threshold associated with the PWM signal.

12. The method of claim 11, wherein providing the first control signal and the second control signal comprises providing the first control signal during a first portion of the duration of the on-time and providing the second control signal during a second portion of the duration of the on-time.

13. The method of claim 11, wherein providing the first control signal and the second control signal comprises: providing the first control signal substantially concurrently with the on-time and not providing the second control signal during a period of the PWM signal in response to the on-time being less than the duty-cycle threshold associated with the period of the PWM signal; and providing the first control signal and the second control signal alternately and individually with respect to each respective period of the PWM signal in response to the on-time being greater than the duty-cycle threshold associated with the PWM signal.

14. A transformer-coupled gate-drive power regulator system comprising:
a feedback stage configured to generate a pulse-width modulation (PWM) signal having a duty-cycle that is based on a magnitude of an output voltage in an output stage, the duty-cycle being defined by an on-time in a given period of the PWM signal;
a switch driver stage comprising a duty-cycle comparator configured to compare the on-time with a duty-cycle threshold, the switch driver stage being configured to provide each of a first control signal and a second control signal based on the duration of the on-time relative to the duty-cycle threshold; and
a switching stage comprising a first signal transformer input stage, a second signal transformer input stage, and a control switch, the first signal transformer input stage being configured to activate the control switch via the first control signal while the second signal transformer input stage is deactivated, the second signal transformer input stage being configured to activate the control switch via the second control signal while the first signal transformer input stage is deactivated, and the control switch being configured to provide current through an output inductor in the output stage to generate the output voltage in response to being activated, wherein the switch driver stage is configured to provide the first control signal during a first portion of the duration of the on-time and to provide the second control signal during a second portion of the duration of the on-time in response to the on-time being greater than the duty-cycle threshold.

15. The system of claim 14, wherein the switch driver stage is configured to provide the first and second control signals alternately and individually with respect to each period of the PWM signal in response to the on-time being greater than the duty-cycle threshold.

* * * * *